(12) United States Patent
Kawakami

(10) Patent No.: US 7,046,971 B2
(45) Date of Patent: May 16, 2006

(54) DISTORTION-CORRECTING CIRCUIT, INTEGRATED CIRCUIT, AND RADIO COMMUNICATION DEVICE

(75) Inventor: Masayuki Kawakami, Sapporo (JP)

(73) Assignee: Seiko Epson Corporation, Tokyo (JP)

( * ) Notice: Subject to any disclaimer, the term of this patent is extended or adjusted under 35 U.S.C. 154(b) by 540 days.

(21) Appl. No.: 10/347,627

(22) Filed: Jan. 22, 2003

(65) Prior Publication Data

US 2003/0153270 A1 Aug. 14, 2003

(30) Foreign Application Priority Data

Feb. 14, 2002 (JP) .............................. 2002-036778

(51) Int. Cl.
*H04B 1/04* (2006.01)
*H04K 5/08* (2006.01)
*H04L 5/00* (2006.01)
*H03F 1/26* (2006.01)

(52) U.S. Cl. ................................ 455/114.2; 455/114.3; 455/63.1; 455/67.11; 327/307; 327/317; 327/327; 330/149

(58) Field of Classification Search .. 455/114.1–114.4, 455/63.1, 67.11, 67.13, 115.1, 127.2, 127.3, 455/295; 330/149, 124 R; 327/307, 317, 327/327, 328
See application file for complete search history.

(56) References Cited

U.S. PATENT DOCUMENTS

| 4,392,252 A | 7/1983 | Cluniat |
| 4,617,522 A * | 10/1986 | Tarbutton et al. ........... 330/149 |
| 4,891,607 A * | 1/1990 | Felps .......................... 330/296 |
| 5,015,965 A * | 5/1991 | Katz et al. ................... 330/149 |
| 5,126,687 A | 6/1992 | Onoda et al. |

(Continued)

FOREIGN PATENT DOCUMENTS

GB 1 519 254 7/1978

(Continued)

OTHER PUBLICATIONS

R.D. Stewart et al., "Predistortion Linearisation of Amplifiers for UHF Mobile Radio," Proceedings of the European Microwave Conference, Folklets Hus, Turnbridge Wells, Microwave Exhibitions, GB, vol. Conf. 18, pp. 1017-1022 {Sep. 12, 1998}.

*Primary Examiner*—Duc M. Nguyen
(74) *Attorney, Agent, or Firm*—Oliff & Berridge, PLC

(57) ABSTRACT

To down size a distortion-correcting circuit. In the case of a distortion-correcting circuit 1, a basic-wave-amplifying section 10 and a distortion-extracting section 20 have the same circuit configuration. Therefore, the basic-wave-amplifying section 10 and the distortion-extracting section 20 have almost equal input impedance and output impedance and make it possible to distribute and synthesize signal powers without using any power distributor or any power synthesizer. Moreover, because the distortion-correcting circuit 1 is constituted by only a transistor, a resistance, a capacitor, or an inductor, it is easy to downsize the circuit 1 and constitute the circuit 1 into an integrated circuit. Therefore, a characteristic of the basic-wave-amplifying section 10 and that of the distortion-extracting section 20 are further similar to each other and it is possible to more properly distribute or synthesize signal powers without using any power distributor or any power synthesizer.

15 Claims, 13 Drawing Sheets

U.S. PATENT DOCUMENTS

| | | | |
|---|---|---|---|
| 5,258,722 A | 11/1993 | Jeffers | |
| 5,815,038 A * | 9/1998 | Ogura et al. | 330/149 |
| 5,939,920 A | 8/1999 | Hiraizumi et al. | |
| 6,097,250 A * | 8/2000 | Kamali et al. | 330/124 R |
| 6,316,983 B1 * | 11/2001 | Kitamura | 327/317 |
| 6,577,177 B1 * | 6/2003 | Zhou et al. | 327/317 |

FOREIGN PATENT DOCUMENTS

| | | |
|---|---|---|
| JP | A 06-260847 | 9/1994 |
| JP | A 2001-156553 | 6/2001 |
| JP | A 2001-320245 | 11/2001 |
| WO | WO 00/59141 A1 | 10/2000 |

* cited by examiner

DISTORTION-CORRECTING CIRCUIT, INTEGRATED CIRCUIT, AND RADIO COMMUNICATION DEVICE

BACKGROUND OF THE INVENTION

1. Field of the Invention

The present invention relates to a distortion-correcting circuit for decreasing the number of distortions in high-output amplification, an integrated circuit, and a radio communication device.

2. Description of the Related Art

A distortion-correcting circuit has been used so far in the past in order to decrease the number of distortions generated when amplifying signals.

The distortion-correcting circuit is mainly used to decrease the number of distortions in a high-output amplifier used for a radio-communication base station or a satellite-communication base station, that is, a high-output amplifier for a device using a wide frequency band (such as a multicarrier communication device).

In the case of the above high-output amplifier, when amplifying a wide-frequency-band signal such as a multicarrier signal, a distortion (CTB: Composite Triple Beat) occurs in addition to a desired wave (purposed output signal).

Therefore, when no distortion-correcting circuit is used, it is obliged to back off an operating point in a high-output amplifier in order to decrease the number of distortions. In this case, by forming the operating point into a linear region, a desired electrical characteristic is obtained and a distortion suppression characteristic is improved but the power added efficiency is deteriorated and much heat is produced. That is, when no distortion-correcting circuit is used, the power added efficiency and distortion suppression characteristic are kept in the relation of trade-off.

Therefore, to improve the power added efficiency and distortion suppression characteristic at the same time, a distortion-correcting circuit is used.

FIG. 14 is a block diagram showing a conventional distortion-correcting circuit 100.

In FIG. 14, the distortion-correcting circuit 100 is constituted by including a power distributor 110, a delay line 120, a power synthesizer 130, and a distortion-extracting section 140.

The power distributor 110 secures matching and isolation between input impedances and distributes powers of input signals (Pin) in order to prevent reflection and interference from occurring between the system of the delay line 120 of the distortion-correcting circuit 100 and the system of the distortion-extracting section 140 because impedances of the both systems are different from each other.

The delay line 120 matches the phase of a received signal with the phase of a signal input to the distortion-extracting section 140.

The power synthesizer 130 has a function reverse to that of the power distributor 110 and synthesizes two input signals (signal input from delay line 120 and signal input from distortion-extracting section 140).

The distortion-extracting section 140 is constituted by further including a power distributor 141, attenuators 142 and 146, amplifiers 143 and 145, and a power synthesizer 144.

The power distributor 141 has a function same as that of the power distributor 110 and distributes powers of signals input from the power distributor 110 to the distortion-extracting section 140.

The attenuators 142 and 146 respectively attenuate an input signal power by a set predetermined gain.

The amplifiers 143 and 145 respectively amplify an input signal power by a set predetermined gain.

The power synthesizer 144 has a function same as that of the power synthesizer 130 and synthesizes two input signals (signals output from two processing systems of distortion-extracting section 140).

In the above configuration, input signals (Pin) are distributed and input to the delay line 120 and distortion-extracting section 140 in the power distributor 110 and distortion components are extracted from input signals of the distortion-correcting circuit 100 of the distortion-extracting section 140. Then, distortion components are inverted and synthesized for input signals whose phases are matched by the delay line 120 in the power synthesizer 130 and thus, output signals (Pout) from which most distortions are removed are obtained.

However, because the conventional distortion-correcting circuit 100 uses passive components such as the power distributors 110 and 141, power synthesizers 130 and 144, and delay line 120, there is a problem that a circuit scale is increased because of these components. Though this problem can be admitted by a large communication device such as a radio-communication base station system, it becomes a large problem for a device which must be decreased in size or constituted by an integrated circuit such as a consumer product.

SUMMARY OF THE INVENTION

It is an object of the present invention to downsize a distortion-correcting circuit.

To solve the above problems, the present invention uses a distortion-correcting circuit comprising a phase-adjusting section (e.g. basic-wave-amplifying section 10 in FIG. 1) for adjusting the phase of a purposed-wave component (e.g. a basic wave in an embodiment of the present invention) to be amplified in input signals and a distortion-extracting section (e.g. distortion-extracting section 20 in FIG. 1) for extracting a distortion-correcting component obtained by inverting a distortion component generated when amplifying the input signals from the input signals to synthesize and output the purposed-wave component output by the phase-adjusting section and the distortion-correcting component extracted by the distortion-extracting section, in which the phase-adjusting section and the distortion-extracting section are designed at the same input impedance and input signals are input to the phase-adjusting section and distortion-extracting section in parallel while they are not actively power-distributed.

In this case, the expression "input signals are not actively power-distributed" represents distributing input signals by a transistor or the like not including a factor to be incorporated mainly for a power-distributing function like a power distributor or not purposing branch of a wiring, a passive device such as a resistance, capacitor, or coil or power distribution (for example, purposing securing of isolation).

Moreover, the input signals are directly input to the phase-adjusting section and distortion-extracting section in parallel.

Furthermore, the input signals are input to the phase-adjusting section and distortion-extracting section in parallel through a resistance.

Furthermore, the input signals are input to the phase-adjusting section and distortion-extracting section in parallel through a capacitor.

Furthermore, the input signals are input to the phase-adjusting section and distortion-extracting section in parallel through a differential amplifier.

Furthermore, the phase-adjusting section has a circuit configuration same as the circuit configuration of the distortion-extracting section about a factor for changing phases.

Furthermore, the phase-adjusting section is constituted by a transistor.

Furthermore, the distortion-extracting section includes a first p-type transistor (e.g. transistor 21 in FIG. 1) whose gate is connected to an input node to which the input signals are input, a first n-type transistor (e.g. transistor 22 in FIG. 1) whose gate is connected to the input node through a first attenuator (e.g. attenuator 25 in FIG. 1), a second attenuator (e.g. attenuator 26 in FIG. 1) connected to the source of the first p-type transistor, and an output load (e.g. resistance 27 in FIG. 1) for connecting the source of the first p-type transistor with the drain of the first n-type transistor, a first-stage circuit using a signal at an output node for connecting the output of the second attenuator with the drain of the first n-type transistor as an output, and a second-stage circuit constituted by a first complementary transistor (e.g. CMOS constituted by transistors 23 and 24 in FIG. 1) for amplifying an output of the first-stage circuit and the phase-adjusting section includes a second complementary transistor (e.g. CMOS 10*a* in FIG. 1) constituted by a second p-type transistor and a second n-type transistor having the same characteristics as the first p-type transistor and first n-type transistor of the first-stage circuit respectively and a third complementary transistor (e.g. CMOS 10*b* in FIG. 1) having the same characteristic as the first complementary transistor to amplify an output signal of the second complementary transistor.

In this case, the same characteristics do not represent that transistors have the physically completely same characteristics but they represent that either transistors are constituted while expecting that they have the same characteristics or transistors are provided with characteristics closer to each other by being formed on positions close to each other on a semiconductor substrate, thereby having a certain width.

Moreover, the output load is constituted by a resistance.

Furthermore, the output load is constituted by an inductor.

Furthermore, the output load is constituted by a circuit in which a resistance and a capacitor are connected in parallel.

Furthermore, the output load is constituted by a circuit in which a resistance, capacitor, and inductor are connected in parallel.

Furthermore, the phase-adjusting section is constituted by an inductor and capacitor.

Furthermore, the phase-adjusting section is constituted by a microstrip line formed on a semiconductor substrate.

Furthermore, the phase-adjusting section is constituted by a strip line formed on an internal layer of a semiconductor substrate.

Furthermore, the phase-adjusting section and distortion-extracting section are constituted as integrated circuits fabricated by the same process.

Furthermore, the phase-adjusting section and distortion-extracting section are designed at the same output impedance and output signals are synthesized without being actively power-synthesized and used as output signals of the distortion-correcting circuit.

Furthermore, output signals of the phase-adjusting section and distortion-extracting section are directly synthesized by connecting signal lines of the output signals.

Furthermore, output signals of the phase-adjusting section and distortion-extracting section are directly synthesized by connecting signal lines of the output signals through a resistance.

Furthermore, output signals of the phase-adjusting section and distortion-extracting section are directly synthesized by connecting signal lines of the output signals through a transistor.

Furthermore, the present invention is;

an integrated circuit including a phase-adjusting section for adjusting the phase of a purposed-wave component to be amplified in input signals and a distortion-extracting section for extracting a distortion-correcting component obtained by inverting a distortion component generated when amplifying input signals from the input signals to synthesize and output the purposed-wave component output by the phase-adjusting section and the distortion-correcting component extracted by the distortion-extracting section, in which the phase-adjusting section and distortion-extracting section are designed at the same input impedance and input signals are input to the phase-adjusting section and distortion-extracting section in parallel without being actively power-distributed.

Furthermore, the input signals are directly input to the phase-adjusting section and distortion-extracting section in parallel.

Furthermore, the input signals are input to the phase-adjusting section and distortion-extracting section in parallel through a resistance.

Furthermore, the input signals are input to the phase-adjusting section and distortion-extracting section in parallel through a capacitor.

Furthermore, the input signals are input to the phase-adjusting section and distortion-extracting section in parallel through a differential amplifier.

Furthermore, the phase-adjusting section has a circuit configuration same as the circuit configuration of the distortion-extracting section about a factor for changing phases.

Furthermore, the phase-adjusting section is constituted by a transistor.

Furthermore, the distortion-extracting section includes;

a first p-type transistor whose gate is connected to an input node to which the input signals are input, a first n-type transistor whose gate is connected to the input node through a first attenuator, a second attenuator connected to the source of the first p-type transistor, an output load for connecting the source of the first p-type transistor with the drain of the first n-type transistor, a first-stage circuit using a signal at an output node for connecting the output of the second attenuator with the drain of the first n-type transistor as an output, and a second-stage circuit constituted by a first complementary transistor for amplifying an output of the first-stage circuit, and the phase-adjusting section includes;

a second complementary transistor constituted by a second p-type transistor and a second n-type transistor having the same characteristics as the first p-type transistor and first n-type transistor of the first-stage circuit respectively and a third complementary transistor having the same characteristic as the first complementary transistor to amplify an output signal of the second complementary transistor.

Furthermore, the output load is constituted by a resistance.

Furthermore, the output load is constituted by an inductor.

Furthermore, the output load is constituted by a circuit in which a resistance and capacitor are connected in parallel.

Furthermore, the output load is constituted by a circuit in which a resistance, capacitor, and inductor are connected in parallel.

Furthermore, the phase-adjusting section is constituted by an inductor and capacitor.

Furthermore, the phase-adjusting section is constituted by a microstrip line formed on a semiconductor substrate.

Furthermore, the phase-adjusting section is constituted by a strip line formed on an internal layer of a semiconductor substrate.

Furthermore, the phase-adjusting section and distortion-extracting section are fabricated by the same process.

Furthermore, the phase-adjusting section and distortion-extracting section are designed at the same output impedance and output signals are synthesized without being actively power-synthesized and used as output signals of the integrated circuit.

Furthermore, output signals of the phase-adjusting section and distortion-extracting section are directly synthesized by connecting signal lines of the output signals.

Furthermore, output signals of the phase-adjusting section and distortion-extracting section are synthesized by connecting signal lines of the output signals through a resistance.

Furthermore, output signals of the phase-adjusting section and distortion-extracting section are synthesized by connecting signal lines of the output signals through a transistor.

Furthermore, the present invention is;

a radio communication device provided with a distortion-correcting section including a phase-adjusting section for adjusting the phase of a purposed-wave component to be amplified in input signals and a distortion-extracting section for extracting a distortion-correcting component obtained by inverting a distortion component generated when amplifying input signals from the input signals to synthesize and output the purposed-wave component output by the phase-adjusting section and the distortion-correcting component extracted by the distortion-extracting section, in which the phase-adjusting section and distortion-extracting section are designed at the same input impedance and input signals are input to the phase-adjusting section and distortion-extracting section in parallel without being actively power-distributed.

Furthermore, the input signals are directly input to the phase-adjusting section and distortion-extracting section in parallel.

Furthermore, the input signals are input to the phase-adjusting section and distortion-extracting section in parallel through a resistance.

Furthermore, the input signals are input to the phase-adjusting section and distortion-extracting section in parallel through a capacitor.

Furthermore, the input signals are input to the phase-adjusting section and distortion-extracting section in parallel through a differential amplifier.

Furthermore, the phase-adjusting section has a circuit configuration same as the circuit configuration of the distortion-extracting section about a factor for changing phases.

Furthermore, the phase-adjusting section is constituted by a transistor.

Furthermore, the distortion-extracting section includes;

a first p-type transistor whose gate is connected to an input node to which the input signals are input, a first n-type transistor whose gate is connected to the input node through a first attenuator, a second attenuator connected to the source of the first p-type transistor, an output load for connecting the source of the first p-type transistor with the drain of the first n-type transistor, a first-stage circuit using a signal at an output node for connecting the output of the second attenuator with the drain of the first n-type transistor as an output, and a second-stage circuit constituted by a first complementary transistor for amplifying an output of the first-stage circuit, and the phase-adjusting section includes;

a second complementary transistor constituted by a second p-type transistor and a second n-type transistor having the same characteristics as the first p-type transistor and first n-type transistor of the first-stage circuit respectively and a third complementary transistor having the same characteristic as the first complementary transistor to amplify an output signal of the second complementary transistor.

Furthermore, the output load is constituted by a resistance.

Furthermore, the output load is constituted by an inductor.

Furthermore, the output load is constituted by a circuit in which a resistance and capacitor are connected in parallel.

Furthermore, the output load is constituted by a circuit in which a resistance, capacitor, and inductor are connected in parallel.

Furthermore, the phase-adjusting section is constituted by an inductor and capacitor.

Furthermore, the phase-adjusting section is constituted by a microstrip line formed on a semiconductor substrate.

Furthermore, the phase-adjusting section is constituted by a strip line formed on an internal layer of a semiconductor substrate.

Furthermore, the phase-adjusting section and distortion-extracting section are constituted as integrated circuits fabricated by the same process.

Furthermore, the phase-adjusting section and distortion-extracting section are designed at the same output impedance and output signals are synthesized without being actively power-synthesized and used as output signals of the integrated circuit.

Furthermore, output signals of the phase-adjusting section and distortion-extracting section are directly synthesized by connecting signal lines of the output signals.

Furthermore, output signals of the phase-adjusting section and distortion-extracting section are synthesized by connecting signal lines of the output signals through a resistance.

Furthermore, output signals of the phase-adjusting section and distortion-extracting section are synthesized by connecting signal lines of the output signals through a transistor.

Furthermore, the distortion-correcting section is constituted as an integrated circuit formed on a semiconductor substrate.

According to the present invention, a phase-adjusting section and a distortion-extracting section are constituted so as to have the same characteristics (input impedance and circuit configuration).

Therefore, it is possible to distribute or synthesize signal powers without including a power distributor or power synthesizer. That is, because it is not necessary to use a power distributor or power synthesizer that is a large circuit, it is possible to downsize a distortion-correcting circuit.

Moreover, because a distortion-correcting circuit is constituted only by a transistor, resistance, and capacitor or inductor, it is easy to downsize the distortion-correcting circuit or constitute the distortion-correcting into an integrated circuit. Thereby, characteristics (input/output impedance and the like) of a phase-adjusting section and those (input/output impedance and the like) of a distortion-correcting section become further similar to each other and it is possible to more properly distribute or synthesize signal powers without using a power distributor or power synthesizer.

Moreover, it is possible to operate a distortion-correcting circuit at a small power consumption and a high speed because the circuit is constituted into an integrated circuit and uses a CMOS.

DETAILED DESCRIPTION OF THE PREFERRED EMBODIMENTS

An embodiment of a distortion-correcting circuit 1 of the present invention will be described below in detail by referring to the accompanying drawings.

First, a configuration will be described.

Figure 1:
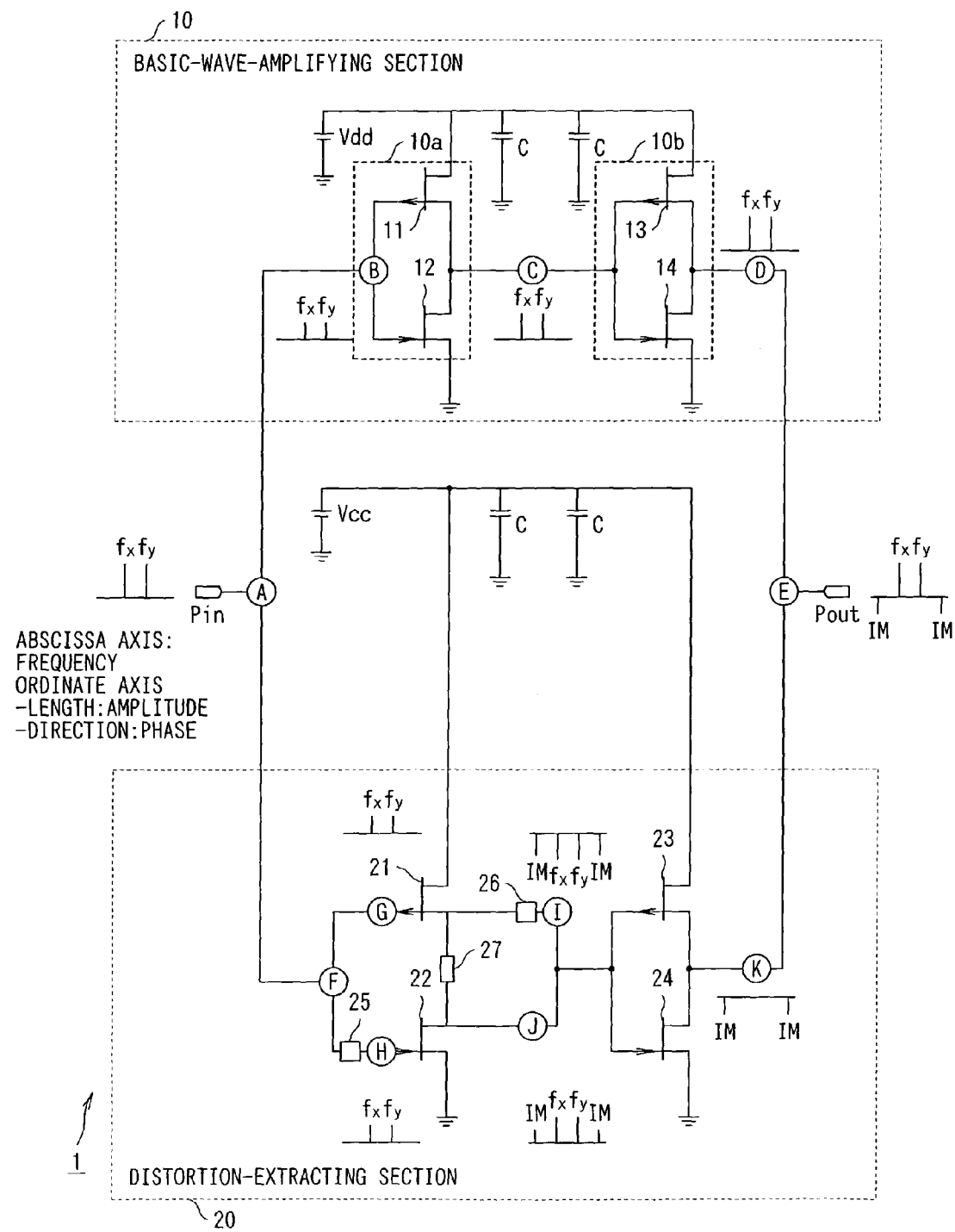
FIG. 1 is an illustration showing a configuration of a distortion-correcting circuit 1 to which the present invention is applied.

FIG. 1 is an illustration showing a configuration of the distortion-correcting circuit 1 to which the present invention is applied. In FIG. 1, the distortion-correcting circuit 1 is constituted by including a basic-wave-amplifying section 10 and a distortion-extracting section 20. FIG. 1 also shows states of signals fx and fy (abscissa axis: frequency, ordinate axis: length-amplitude and direction-phase) at nodes A to K.

The basic-wave-amplifying section 10 is constituted by further including transistors 11 to 14. The transistors 11 and 13 are p-channel FETs (Field Effect Transistors) and the transistors 12 and 14 are n-channel FETs. Gates of the transistors 11 and 12 are connected each other to constitute a CMOS (Complementary Metal Oxide Semiconductor) 10a. Similarly, the transistors 13 and 14 constitute a CMOS 10b that is connected to the rear stage of the CMOS 10a in series. Furthermore, a bias voltage Vdd is applied to drains of the transistors 11 and 13.

The distortion-extracting section 20 is constituted by further including transistors 21 to 24, attenuators 25 and 26, and a resistance 27. The transistors 21 and 23 are p-channel FETs and the transistors 22 and 24 are n-channel FETs. Moreover, gates of the transistors 21 and 22 are connected each other to constitute a CMOS 20a. Similarly, the transistors 23 and 24 constitute a CMOS 20b that is connected to the rear stage of the CMOS 20a in series. Furthermore, a bias voltage Vcc is applied to drains of the transistors 21 and 23.

Furthermore, the attenuator 25 is connected to the front stage of the gate of the transistor 22 and the attenuator 26 is connected to the rear stage of the source of the transistor 21. These attenuators 25 and 26 respectively attenuate an input signal by a preset gain. Furthermore, the source of the transistor 21 is connected with the drain of the transistor 22 through the resistance 27 and the current circulating between the source of the transistor 21 and the drain of the transistor 22 is restricted by the resistance 27.

In this case, the transistors 21 to 24 and the transistors 11 to 14 have the same characteristics, respectively. Moreover, the attenuators 25 and 26 and the resistance 27 are devices not changing phases. Therefore, the basic-wave-amplifying section 10 and distortion-extracting section 20 have almost-equal input impedance and output impedance and an output signal of the basic-wave-amplifying section 10 and that of the distortion-extracting section 20 coincide with each other in phase.

Therefore, the basic-wave-amplifying section 10 has a function of a delay line and amplifies basic waves (signal components to be amplified) in input signals without greatly generating distortions. Moreover, the distortion-extracting section 20 extracts only distortion components in input signals and outputs inverted distortion components. Then, the basic wave and the inverted distortion component are synthesized to serve as an output signal of the distortion-correcting circuit 1.

Then, operations are described.

Operations for the distortion-correcting circuit 1 to process input signals Pin will be described below by referring to FIG. 1.

In FIG. 1, signals in which signals fx and fy are multiplexed are input as input signals Pin of the distortion-correcting circuit 1. Because the input signals Pin are multicarrier signals, a plurality of signals may be multiplexed on the input signals Pin. In this case, however, it is assumed that two signals fx and fy are multiplexed in order to simplify the description.

Powers of the input signals Pin are distributed to the basic-wave-amplifying section 10 and distortion-extracting section 20 at the node A. In this case, because the basic-wave-amplifying section 10 and distortion-extracting section 20 have almost equal input impedance, the input signals Pin are distributed at equal power. That is, signal states at nodes B, F, and G become the same.

After the power is distributed at the node A, the input signal is input to the CMOS 10a of the basic-wave-amplifying section 10. The input signal is further distributed at equal power at the node B of the CMOS 10a. Then, distributed signal powers are amplified by the transistors 11 and 12 and output to the node C and then input to the CMOS 10b. That is, the input signals amplified by a predetermined gain by the CMOS 10a are input to the CMOS 10b.

The CMOS 10b amplifies the input signals the same as the CMOS 10a does and outputs them to the node D.

In this case, each transistor of the basic-wave-amplifying section 10 linearly operates and the signal output to the node D becomes a signal hardly including distortions.

However, input signals distributed at the node A and input to the distortion-extracting section 20 are processed as described below.

First, the input signals are distributed to the transistor 21 and attenuator 25 at the node F. In this case, because the processing system including the transistor 21 (processing system constituted by the transistor 21 and attenuator 26) and the processing system including the attenuator 25 (processing system constituted by the attenuator 25 and transistor 22) have almost equal input impedance, the input signals are distributed at equal power.

Then, the distributed input signals are processed by the processing system including the transistor 21 and the processing system including the attenuator 25, respectively.

A gain for processing an output signal is described below.

First, a basic-wave component of input signals will be described.

When assuming that the transistors 21 and 22 linearly operate, the relation of (gain of output signal)=(gain of input signal)+(gain of transistor) is effectuated, in each transistor.

In this case, for example, when assuming the gain of an input signal as 10 (dBm), that of each of the transistors 21 and 22 as 10 (dBm), and that of each of the attenuators 25 and 26 as −3 (dBm), the gain of an output signal of the processing system including the transistor 21 becomes 10 (dBm) (gain of input signal)+10(dBm) (gain of transistor 21)−3 (dBm) (gain of attenuator 26)=17 (dBm).

The gain of an output signal of the processing system including the attenuator 25 becomes 10 (dBm) (gain of input signal)−3 (dBm) (gain of attenuator 25)+10 (dBm) (gain of transistor 22)=17 (dBm).

That is, when the transistors 21 and 22 linearly operate, the basic-wave component of an input signal becomes an output signal even when the component is processed by either of two processing systems of the distortion-extracting section 20.

Then, the distortion component of an input signal is described below.

In this case, the distortion component of an input signal (tertiary mutual modulation distortion) is described as an example.

In the case of the distortion component of an input signal, the relation of (gain of distortion component)=3*(gain of input signal)+(gain of transistor) is effectuated.

In this case, when assuming the gain of an input signal as 10 (dBm), that of each of the transistors 21 and 22 as −50 (dBm), and that of each of the attenuators 25 and 26 as −3 (dBm), the gain of an output signal of the processing system including the transistor 21 becomes 3*10 (dBm) (gain of input signal)−50 (dBm) (gain of transistor 21)−3 (dBm) (gain of attenuator 26)=−23 (dBm).

Moreover, the gain of an output signal of the processing system including the attenuator 25 becomes 3*10 (dBm) (gain of input signal)−3 (dBm) (gain of attenuator 25)−50 (dBm) (gain of transistor 22=−29 (dBm).

That is, in the case of the distortion component of an input signal, the gain of an output signal depends on two processing systems of the distortion-extracting section 20.

In FIG. 1, signal states at nodes G, H, I, and J show the above described. Because phases of output signals of the transistors 21 and 22 are opposite to each other, the phase of the signal state at the node J is opposite to that of the signal state at the node I.

Thus, signals output by two processing systems are synthesized and input to a CMOS constituted by the transistors 23 and 24 and amplified at a predetermined gain. In the case of these two output signals, that is, signals at the node K, basic-wave components are offset in output signals of two processing systems and become a signal in which the difference between distortion components is amplified.

Finally, a signal output to the node D by the basic-wave-amplifying section 10 and a signal output to the node K by the distortion-extracting section 20 are synthesized at the node E and become an output signal Pout of the distortion-correcting circuit 1. In this case, because the output impedance of the basic-wave-amplifying section 10 is almost equal to that of the distortion-extracting section 20, the output signals can be synthesized without using a power synthesizer.

Figure 2:
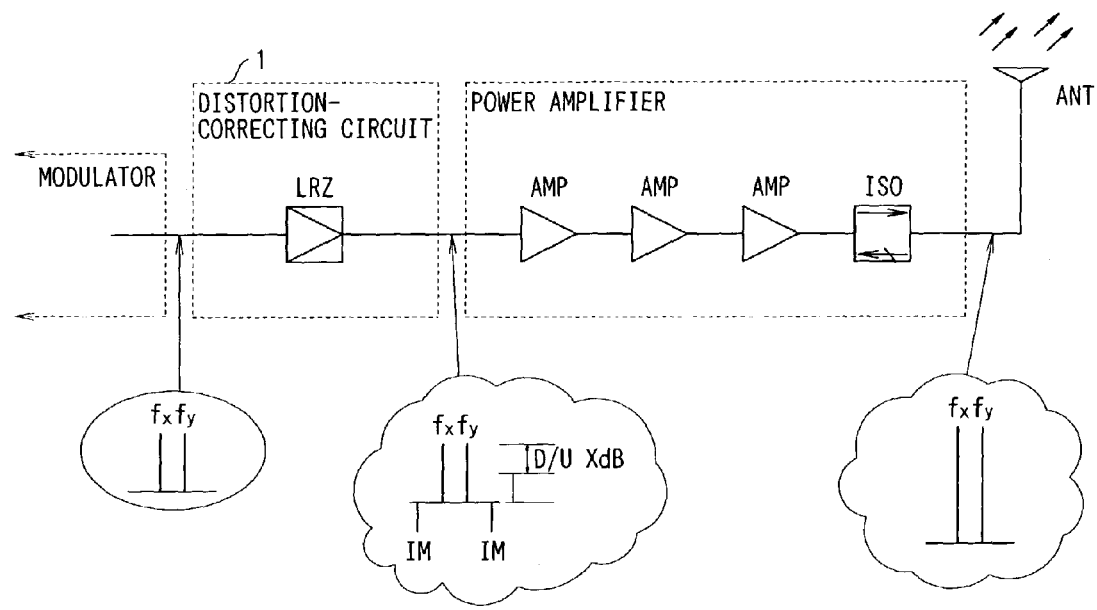
FIG. 2 is an illustration sowing a processing procedure of a multicarrier communication device in which the distortion-correcting circuit 1 is set.

Then, a specific example of a multicarrier communication device into which the distortion-correcting circuit 1 is incorporated is described below. FIG. 2 is an illustration showing a processing procedure of the multicarrier communication device into which the distortion-correcting circuit 1 is incorporated. FIG. 2 also shows basic waves (fx and fy) and a distortion component (IM) in each section.

In FIG. 2, a multicarrier signal output from a modulator includes two signals (fx and fy). The distortion-correcting circuit 1 amplifies the basic wave of the multicarrier signal, extracts a distortion component from the mulitcarrier signal, and outputs a signal to which an inverted distortion component is added to a power amplifier.

In the power amplifier, an input signal is processed by amplifiers of a predetermined number of stages and an isolator and output to an antenna. In this case, a signal output from the power amplifier to the antenna includes an amplified basic wave and a distortion generated in amplification is offset by an inverted distortion component added to an input signal by the distortion-correcting circuit 1.

Figure 3:
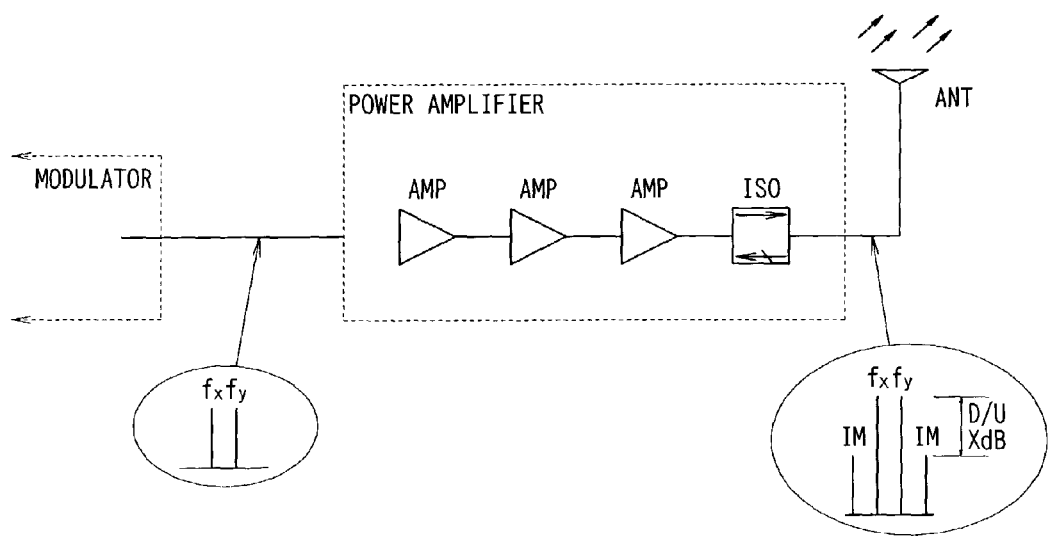
FIG. 3 is an illustration showing a processing procedure of a multicarrier communication device in which no distortion-correcting circuit is set.

On the other hand, FIG. 3 is an illustration showing a processing procedure of a multicarrier communication device into which a distortion-correcting circuit is not incorporated. In FIG. 3, a multicarrier signal output from a modulator is directly input to a power amplifier. Then, in the power amplifier, the signal is processed by amplifiers of a predetermined number of stages and an isolator and output to an antenna. As a result, a signal output from the power amplifier to the antenna includes an amplified basic wave and distortion.

In this case, the quality of an output signal of the power amplifier is decided in accordance with D/U (Desired/Undesire) When assuming that an output signal of the power amplifier shown in FIG. 3 is the same output signal as D/U in an output signal of the power amplifier shown in FIG. 2, signal not including a distortion component is output to the antenna and thereby the signal quality is improved. Moreover, as a result of suppressing a distortion component, the power added efficiency is improved in the power amplifiers.

As described above, in the case of the distortion-correcting circuit 1 of this embodiment, the basic-wave-amplifying section 10 and distortion-extracting section 20 have the same circuit configuration.

Therefore, the basic-wave-amplifying section 10 and distortion-extracting section 20 have almost-equal input impedances and output impedances and thereby, signal powers can be distributed and synthesized without using a power distributor or power synthesizer.

Moreover, because the distortion-correcting circuit 1 is constituted by only a transistor, resistance, capacitor, or inductor, it can be easily downsized and constituted into an integrated circuit. Thereby, the characteristic of the basic-wave-amplifying section 10 and that of the distortion-extracting section 20 are further similar to each other and it is possible to more properly distribute or synthesize signal powers without using a power distributor or power synthesizer.

Furthermore, because the distortion-correcting circuit 1 is constituted into an integrated circuit and moreover uses a CMOS, it can be operated at a small power consumption and a high speed.

It is possible to realize the distortion-correcting circuit 1 of this embodiment by not only the circuit configuration shown in FIG. 1 but also the following circuit.

Figure 4:
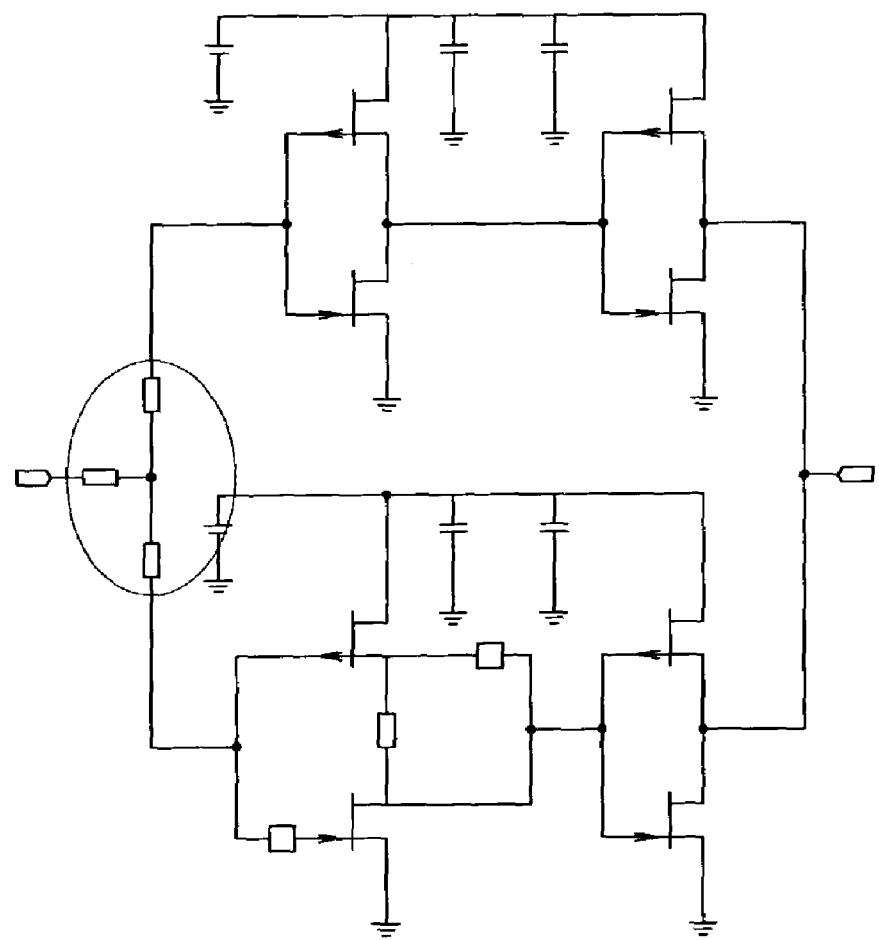
FIG. 4 is a circuit diagram showing a case of distributing signal powers at a node A in FIG. 1 through a resistance.

FIG. 4 is a circuit diagram showing an example for distributing signal powers at the node A in FIG. 1 through a resistance. As shown in FIG. 4, also when distributing signal powers by using a resistance, it is possible to constitute an integrated circuit and moreover, a resistance functions as an isolator.

Figure 5:
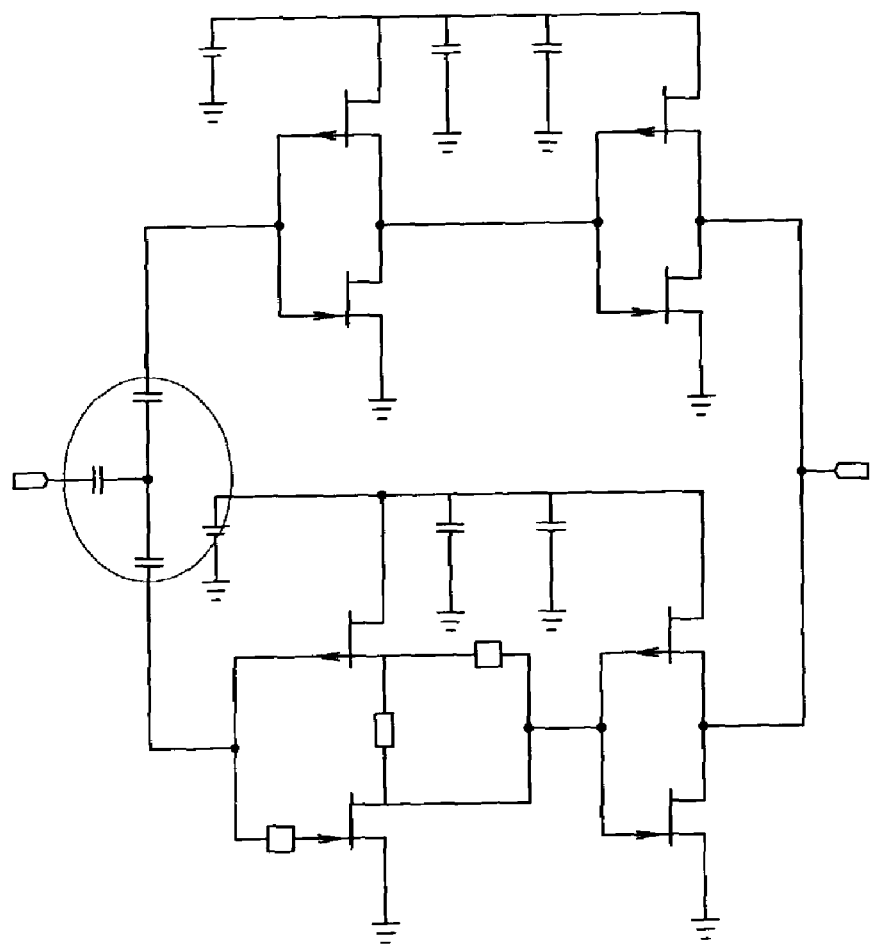
FIG. 5 is a circuit diagram showing a case of distributing signal powers at the node A in FIG. 1 through a capacitor.

FIG. 5 is a circuit diagram showing a case of distributing signal powers at the node A in FIG. 1 through a capacitor.

Figure 6:
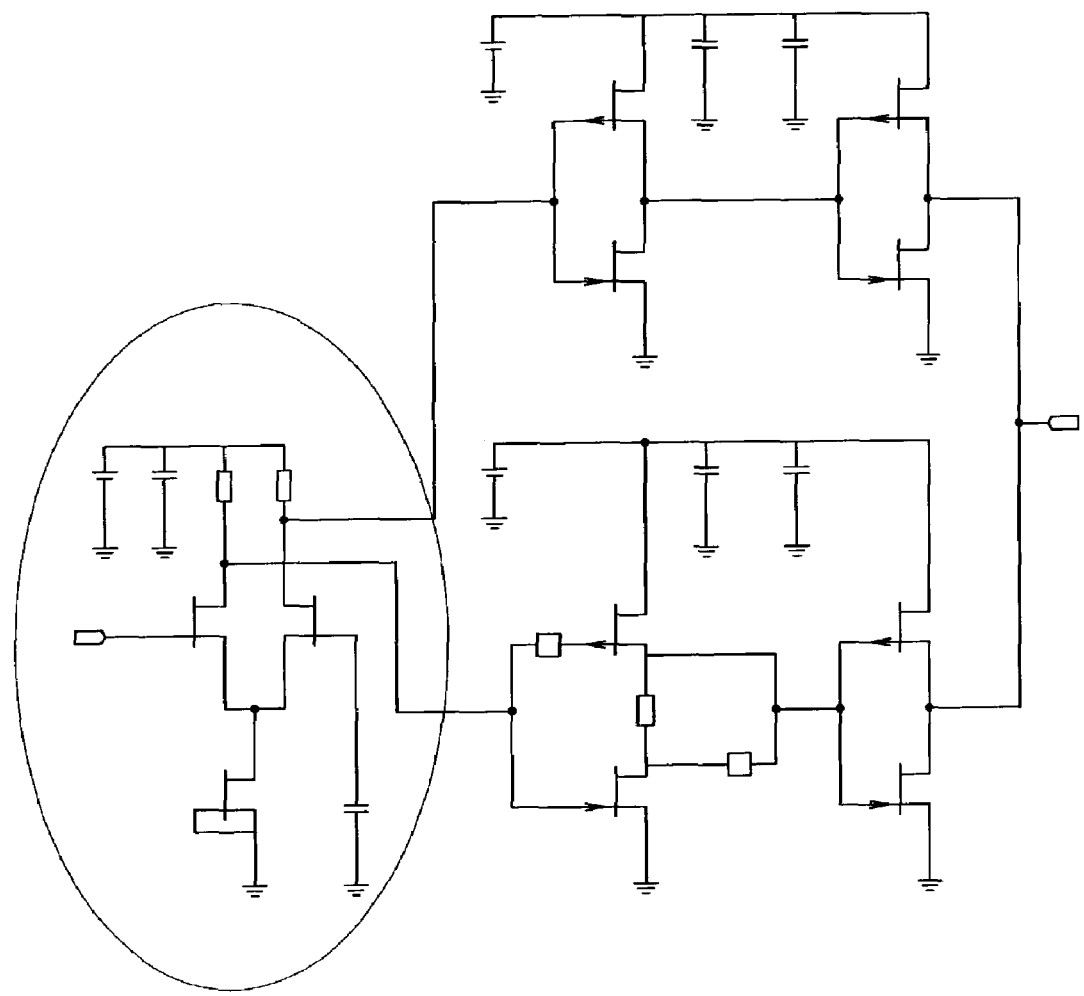
FIG. 6 is a circuit diagram showing a case of distributing signal powers at the node A in FIG. 1 through a differential amplifier.

FIG. 6 is a circuit diagram showing a case of distributing signal powers at the node A in FIG. 1 through a differential amplifier.

Figure 7:
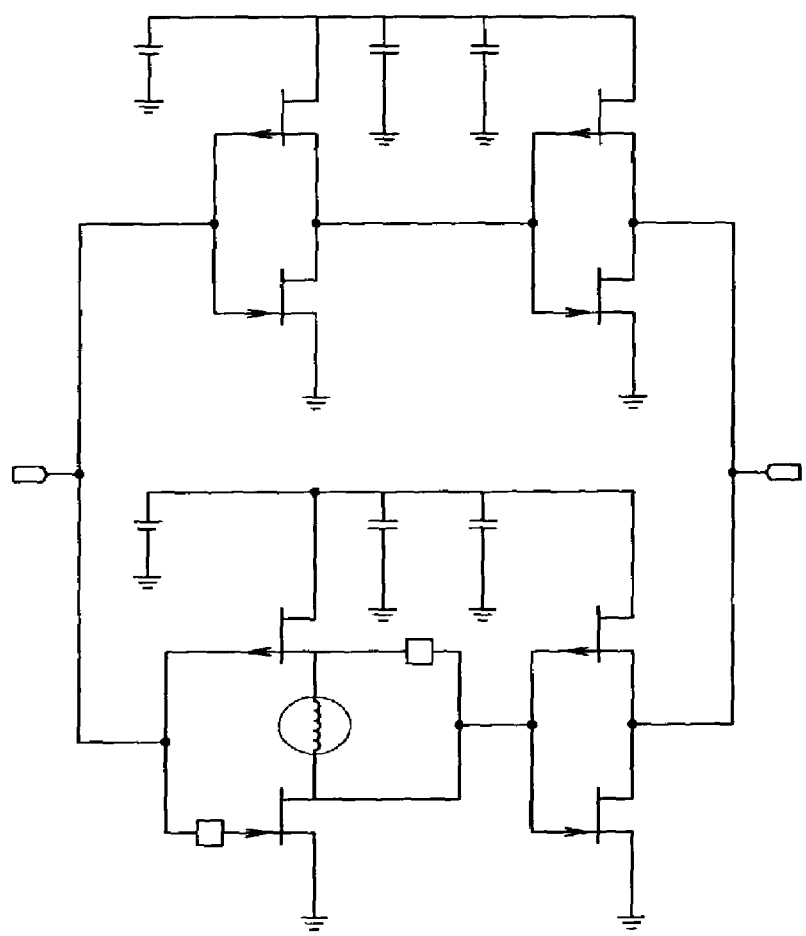
FIG. 7 is a circuit diagram showing a case of using an inductor as the output load of each of the transistors 21 and 22.

FIG. 7 is a circuit diagram showing a case of using an inductor as an output load of each of the transistors 21 and 22.

Figure 8:
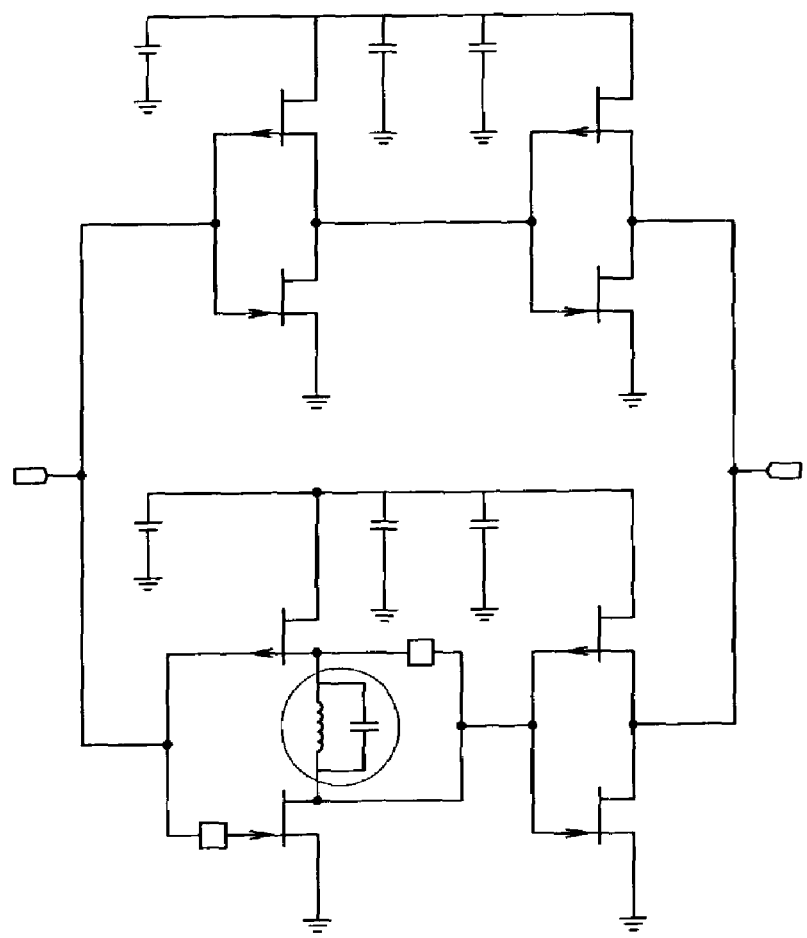
FIG. 8 is an illustration showing a case of using a circuit in which an inductor and a capacity are connected in parallel as the output load of each of the transistors 21 and 22.

FIG. 8 is an illustration showing a case of using a circuit in which an inductor and capacitor are connected in parallel as an output load of each of the transistors 21 and 22.

Figure 9:
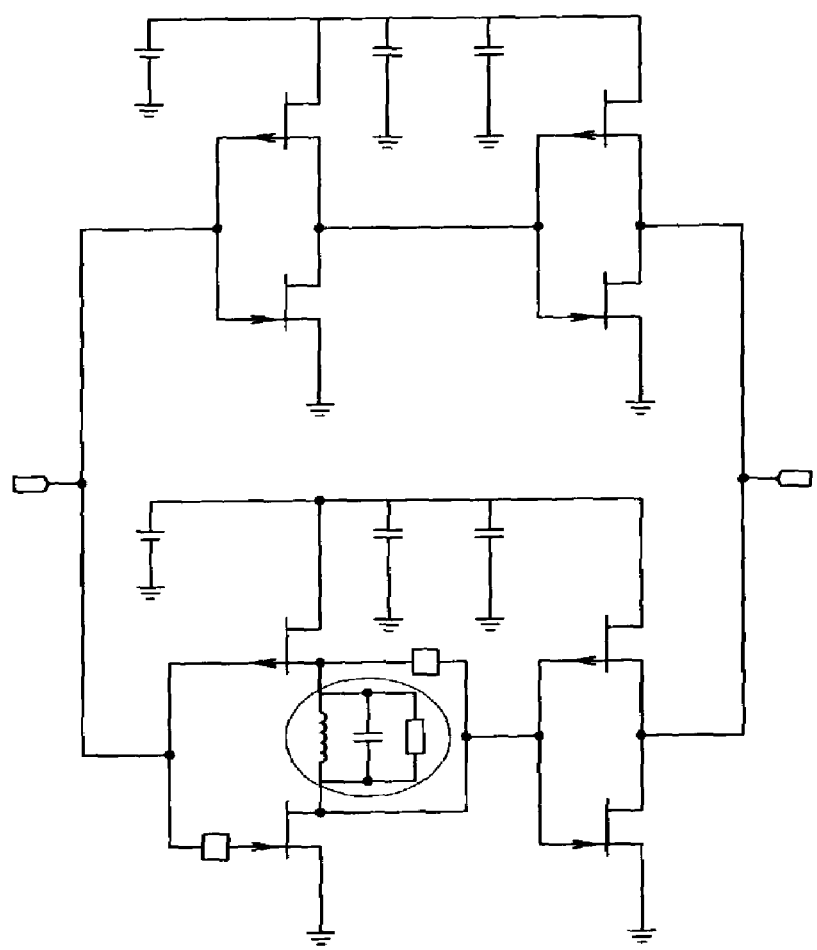
FIG. 9 is an illustration showing a case of using a circuit in which an inductor, a capacitor, and a resistance are connected in parallel as the output load of each of the transistors 21 and 22.

FIG. 9 is an illustration showing a case of using a circuit in which an inductor, capacitor, and resistance are connected in parallel as an output load of each of the transistors 21 and 22.

Figure 10:
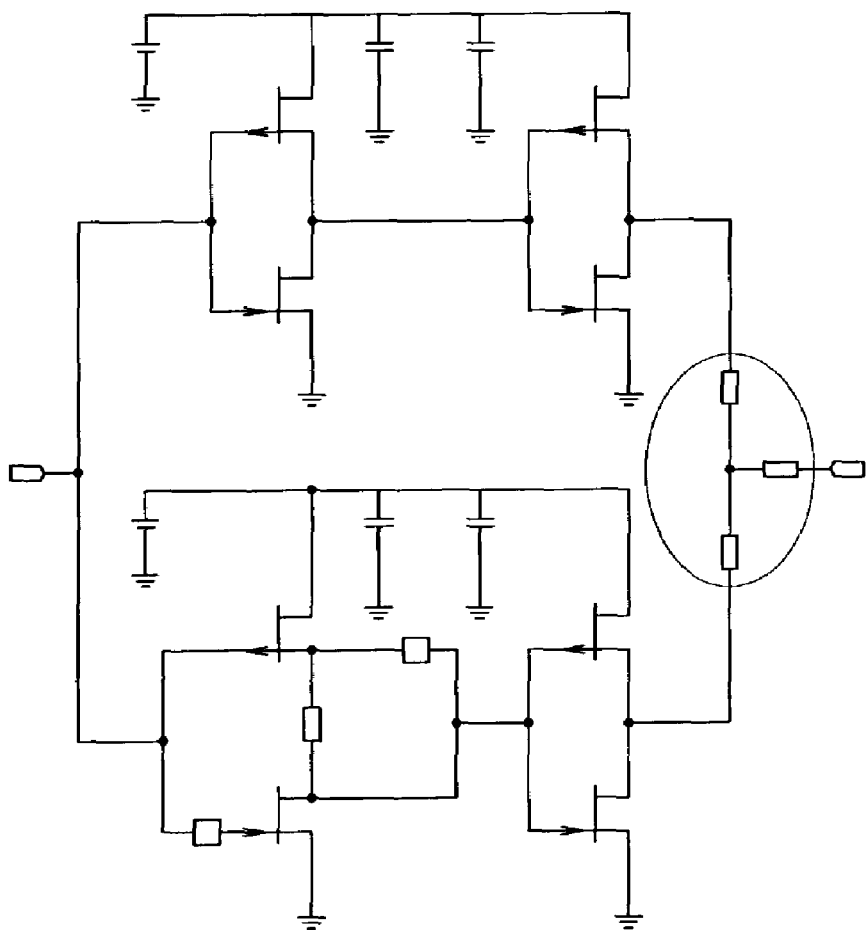
FIG. 10 is a circuit diagram showing a case of synthesizing signal powers at a node E through a resistance.

FIG. 10 is a circuit diagram showing a case of synthesizing signal powers at the node E through a resistance.

Figure 11:
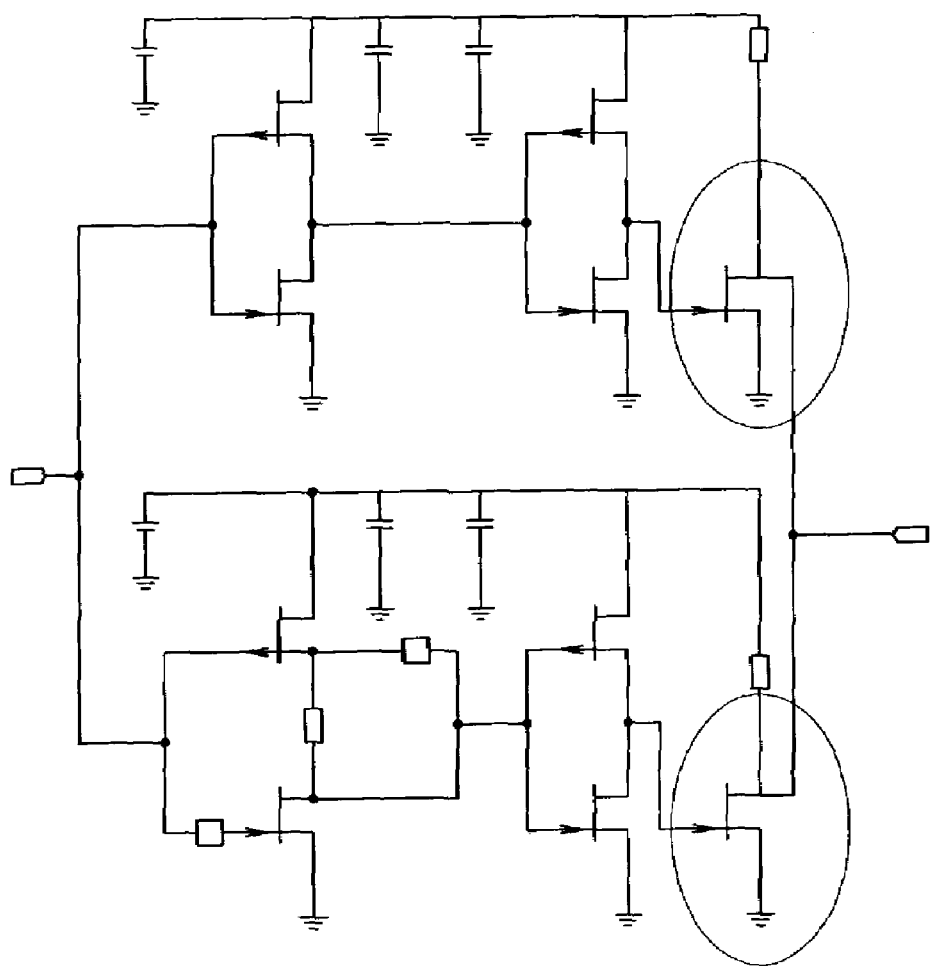
FIG. 11 is a circuit diagram showing a case of synthesizing signal powers at the node E through a transistor.

FIG. 11 is a circuit diagram showing a case of synthesizing signal powers at the node E through a transistor.

Figure 12:
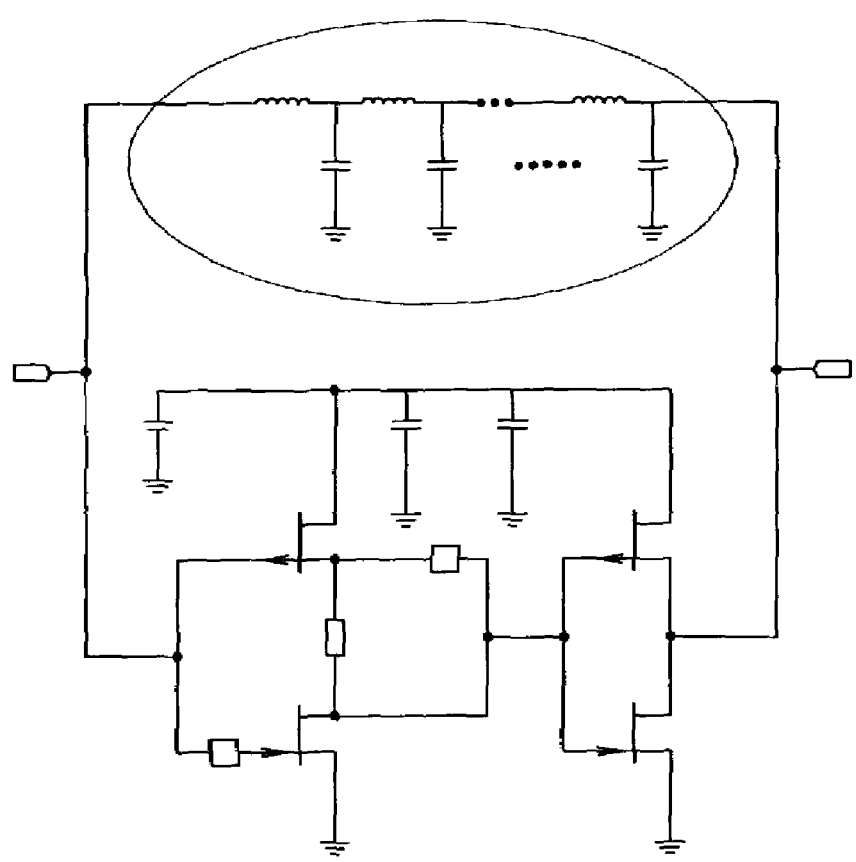
FIG. 12 is a circuit diagram showing a case of constituting a basic-wave-amplifying section 10 by an inductor and capacitor.

FIG. 12 is a circuit diagram showing a case of constituting the basic-wave-amplifying section 10 by an inductor and capacitor.

The basic-wave-amplifying section 10 may be constituted as a microstrip line formed on a semiconductor substrate or a strip line formed in a semiconductor substrate.

Moreover, the distortion-correcting circuit 1 of the present invention can be constituted as an integrated circuit on a semiconductor substrate.

Then, the distortion-correcting circuit 1 is used to correct a distortion when amplifying power in a radio communication device or the like.

Figure 13:
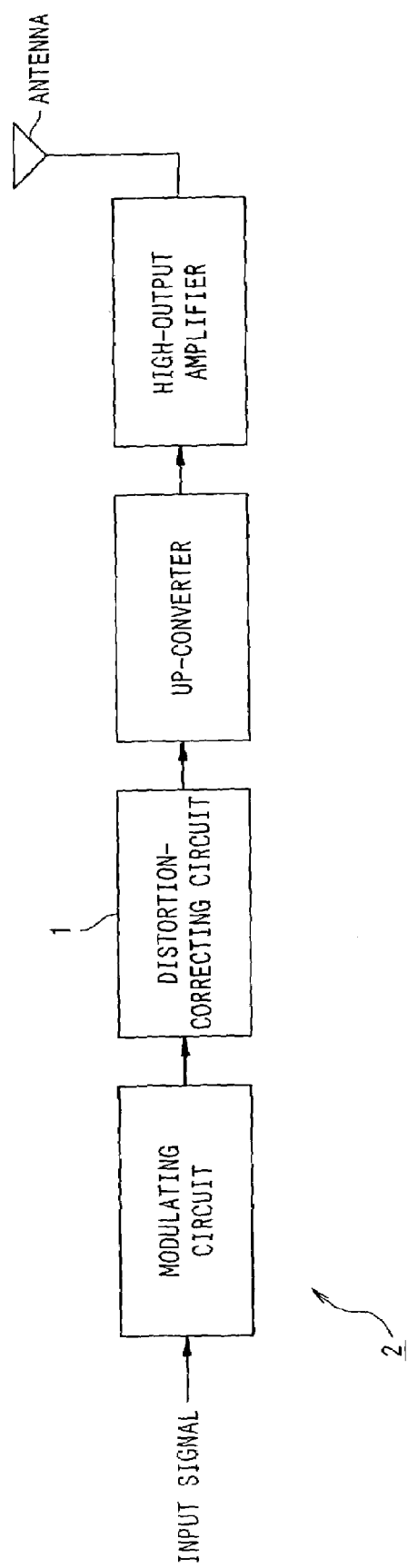
FIG. 13 is a block diagram showing a functional configuration of a radio communication device 2 provided with the distortion-correcting circuit 1.
Figure 14:
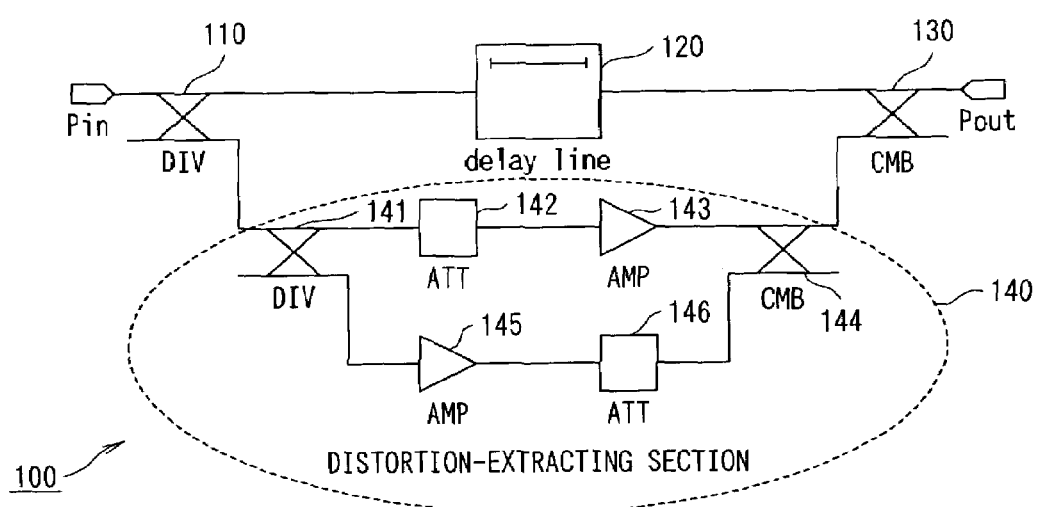
FIG. 14 is a block diagram showing a conventional distortion-correcting circuit 100.

FIG. 13 is a block diagram showing a functional configuration of a radio communication device 2 provided with the distortion-correcting circuit 1.

In FIG. 13, the radio communication device 2 modulates an input signal by a modulation circuit and previously suppresses a distortion component when high-output-amplified by the distortion-correcting circuit 1. Then, the device 2 converts the input signal whose distortion component is suppressed into a transmission frequency band by an up-converter, then power-amplifies the input signal by a high-output amplifier, and transmits the input signal through an antenna.

According to the present invention, a phase-adjusting section and a distortion-extracting section have the same characteristics (input impedance and circuit configuration).

Therefore, it is possible to distribute and synthesize signal powers without using a power distributor or power synthesizer. That is, because it is not necessary to use a power distributor or power synthesizer that is a large circuit, a distortion-correcting circuit can be downsized.

Moreover, because a distortion-correcting circuit is constituted only by a transistor, resistance, and capacitor or inductor, it is easy to downsize the distortion-correcting circuit or constitute the distortion-correcting into an integrated circuit. Thereby, characteristics (input/output impedance and the like) of a phase-adjusting section and those (input/output impedance and the like) of a distortion-correcting section become further similar to each other and it is possible to more properly distribute or synthesize signal powers without using a power distributor or power synthesizer.

Moreover, because a distortion-correcting circuit is constituted into an integrated circuit and uses a CMOS, it can be operated at a small power consumption and a high speed.

What is claimed is:

1. A distortion-correcting circuit comprising:
    a phase-adjusting section for adjusting the phase of a purposed-wave component to be amplified in input signals; and a distortion-extracting section for extracting a distortion-correcting component obtained by inverting a distortion component generated when amplifying input signals from the input signals to synthesize and output the purposed-wave component output by the phase-adjusting section and the distortion-correcting component extracted by the distortion-extraction section,
    wherein said phase-adjusting section and said distortion-extracting section are designed at the same input impedance and input signals are input the phase-adjusting section and distortion-correcting section in parallel while the input signals are not actively power-distributed, and
    wherein the distortion-extracting section includes a first p-type transistor whose gate is connected to an input node to which said input signals are input, a first n-type transistor whose gate is connected with said input node through a first attenuator, a second attenuator connected to the source of said first p-type transistor, a first-stage circuit including an output load for connecting the source of said first p-type transistor with the drain of said first n-type transistor and using a signal at an output node for connecting the output of said second attenuator with the drain of said first n-type transistor as an output, and a second-stage circuit constituted by a first complementary transistor for amplifying the output of the first-stage circuit, and
    said phase-adjusting section includes a second complementary transistor constituted by a second p-type transistor and a second n-type transistor having the same characteristics as those of the first p-type transistor and first n-type transistor of the first-stage circuit respectively, and
    a third complementary transistor having the same characteristics as that of the first complementary transistor to amplify an output signal of the second complementary transistor.

2. The distortion-correcting circuit according to claim 1, wherein said output load is constituted by a resistance.

3. The distortion-correcting circuit according to claim 1, wherein said output load is constituted by an inductor.

4. The distortion-correcting circuit according to claim 1, wherein said output load is constituted by a circuit in which a resistance and a capacitor are connected in parallel.

5. The distortion-correcting circuit according to claim 1, wherein said output load is constituted by a circuit in which a resistance, capacitor, and inductor are connected in parallel.

6. An integrated circuit comprising a phase-adjusting section for adjusting the phase of a purposed-wave component to be amplified in input signals: and a distortion-extracting section for extracting a distortion-correcting component obtained by inverting a distortion component generated when amplifying the input signals from the input signals to output the purposed-wave component output by said phase-adjusting section and the distortion-correcting component extracted by the distortion-extracting section by synthesizing the components,
  wherein said phase-adjusting section and said distortion-extracting section are designed at the same input impedance and input signals are input the phase-adjusting section and distortion-correcting section in parallel while the input signals are not actively power-distributed, and
  wherein said distortion-extracting section includes a first p-type transistor whose gate is connected to an input node to which said input signals are input, a first n-type transistor whose gate is connected with the input node through a first attenuator, a second attenuator connected to the source of the first p-type transistor, a first-stage circuit including an output load for connecting the source of the first p-type transistor with the drain of the first n-type transistor and using a signal at an output node for connecting the output of the second attenuator with the drain of the first n-type transistor as an output, and a second-stage circuit constituted by a first complementary transistor for amplifying the output of the first-stage circuit, and
  the phase-adjusting section includes a second complementary transistor constituted by a second p-type transistor and a second n-type transistor having the same characteristics as those of the first p-type transistor and first n-type transistor of the first-stage circuit respectively, and
  a third complementary transistor having the same characteristic as that of the first complementary transistor to amplify an output signal of the second complementary transistor.

7. The integrated circuit according to claim 6, wherein said output load is constituted by a resistance.

8. The integrated circuit according to claim 6, wherein said output load is constituted by an inductor.

9. The integrated circuit according to claim 6, wherein said output load is constituted by a circuit in which a resistance and a capacitor are connected in parallel.

10. The integrated circuit according to claim 6, wherein said output load is constituted by a circuit in which a resistance, capacitor, and inductor are connected in parallel.

11. A radio communication device comprising:
  a phase-adjusting section for adjusting the phase of a purposed-wave component to be amplified in input signals; a distortion-extracting section for extracting a distortion-correcting component obtained by inverting a distortion component generated when amplifying the input signals from the input signals, and a distortion-correcting section for synthesizing and outputting the purposed-wave component output by the phase-adjusting section and the distortion-correcting component extracted by the distortion-extracting section,
  wherein said phase-adjusting section and said distortion-extracting section are designed at the same input impedance and input signals are input to the phase-adjusting section and distortion-correcting section in parallel while the input signals are not actively power-distributed, and
  wherein said distortion-extracting section includes: a first p-type transistor whose gate is connected to an input node to which the input signals are input; a first n-type transistor whose gate is connected with the input node through a first attenuator; a second attenuator connected to the source of the first p-type transistor; a first-stage circuit including an output load for connecting the source of the first p-type transistor with the drain of the first n-type transistor and using a signal at an output node for connecting the output of the second attenuator with the drain of the first n-type transistor as an output; and a second-stage circuit constituted by a first complementary transistor for amplifying the output of the first-stage circuit, and
  said phase-adjusting section includes a second complementary transistor constituted by a second p-type transistor and a second n-type transistor having the same characteristics as those of the first p-type transistor and first n-type transistor of the first-stage circuit respectively, and
  a third complementary transistor having the same characteristics as that of the first complementary transistor to amplify an output signal of the second complementary transistor.

12. The radio communication device according to claim 11, wherein said output load is constituted by a resistance.

13. The radio communication device according to claim 11, wherein said output load is constituted by an inductor.

14. The radio communication device according to claim 11, wherein said output load is constituted by a circuit in which a resistance and a capacitor are connected in parallel.

15. The radio communication device according to claim 11, wherein said output load is constituted by a circuit in which a resistance, capacitor, and inductor are connected in parallel.

* * * * *